(12) United States Patent
Lee et al.

(10) Patent No.: US 7,183,172 B2
(45) Date of Patent: Feb. 27, 2007

(54) METHOD OF FORMING SILICON-ON-INSULATOR (SOI) SEMICONDUCTOR SUBSTRATE AND SOI SEMICONDUCTOR SUBSTRATE FORMED THEREBY

(75) Inventors: Jung-Il Lee, Gimcheon-shi (KR); Geum-Jong Bae, Suwon-shi (KR); Ki-Chul Kim, Suwon-shi (JP); Hwa-Sung Rhee, Seoul (KR); Sang-Su Kim, Suwon-shi (KR)

(73) Assignee: Samsung Electronics Co., Ltd. (KR)

( * ) Notice: Subject to any disclaimer, the term of this patent is extended or adjusted under 35 U.S.C. 154(b) by 58 days.

(21) Appl. No.: 10/397,447

(22) Filed: Mar. 26, 2003

(65) Prior Publication Data

US 2003/0218212 A1    Nov. 27, 2003

(30) Foreign Application Priority Data

May 22, 2002    (KR) .................... 10-2002-0028480

(51) Int. Cl.
*H01L 21/76* (2006.01)

(52) U.S. Cl. .............. 438/407; 438/423; 438/455; 438/480; 438/481; 438/760

(58) Field of Classification Search ............... 438/149, 438/404, 407, 423, 455, 479, 480, 481, 766, 438/769, 770, 960, 760; 257/347
See application file for complete search history.

(56) References Cited

U.S. PATENT DOCUMENTS 5,362,667 A * 11/1994 Linn et al. ................. 438/455
5,405,802 A * 4/1995 Yamagata et al. .......... 438/459
5,453,394 A * 9/1995 Yonehara et al. .......... 438/455
6,100,166 A * 8/2000 Sakaguchi et al. ......... 438/455
6,380,046 B1 * 4/2002 Yamazaki .................. 438/409
6,468,923 B1 * 10/2002 Yonehara et al. .......... 438/761
6,534,380 B1 * 3/2003 Yamauchi et al. ......... 438/455
6,624,047 B1 * 9/2003 Sakaguchi et al. ......... 438/458
6,670,677 B2 * 12/2003 Choe et al. ................. 257/355
6,828,214 B2 * 12/2004 Notsu et al. ............... 438/455

FOREIGN PATENT DOCUMENTS

| JP | 07249749 | 9/1995 |
| JP | 11251563 | 9/1999 |
| JP | 14026299 | 1/2002 |
| KR | 19990076227 | 10/1999 |

OTHER PUBLICATIONS

English Abstract (07-249749).
English Abstract (11-251563).
English Abstract (14-026299).
English Abstract (1999-0076227).

* cited by examiner

*Primary Examiner*—M. Wilczewski
*Assistant Examiner*—Toniae M. Thomas
(74) *Attorney, Agent, or Firm*—F. Chau & Associates, LLC

(57) ABSTRACT

A method of forming an SOI semiconductor substrate and the SOI semiconductor substrate formed thereby, is provided. The method includes forming sequentially buried oxide, diffusion barrier and SOI layers on a semiconductor substrate. The diffusion barrier layer is formed by an insulating layer having a lower impurity diffusion coefficient as compared with the buried oxide layer. The diffusion barrier layer serves to prevent impurities implanted into the SOI layer from being diffused into the buried oxide layer or the semiconductor substrate.

6 Claims, 10 Drawing Sheets

METHOD OF FORMING SILICON-ON-INSULATOR (SOI) SEMICONDUCTOR SUBSTRATE AND SOI SEMICONDUCTOR SUBSTRATE FORMED THEREBY

FIELD OF THE INVENTION

The present invention relates to a method of forming a semiconductor device and the semiconductor device formed thereby; more particularly, a method of forming an SOI semiconductor substrate and the SOI semiconductor substrate formed thereby.

BACKGROUND OF THE INVENTION

A typical transistor has a source/drain region, which is defined by forming an impurity diffusion layer at a semiconductor substrate. A PN junction is formed between the source/drain region and the semiconductor substrate. Accordingly, the semiconductor substrate and the source/drain region are electrically isolated from each other when a reverse bias is applied therebetween.

With trends toward higher integration of semiconductor devices, a depth of the source/drain region is continually reduced. For this reason, current leakage, current leaked into the semiconductor substrate through the source/drain region, can become a serious problem. One proposed solution to suppress the current leakage is by placing a silicon-on-insulator layer on the substrate (hereinafter referred to as an "SOI substrate"). The SOI substrate has a structure where a buried oxide layer is disposed apart from a surface of the semiconductor substrate at a predetermined depth. The buried oxide layer may serve to prevent the leakage current through the source/drain region. However, in the case that the impurities used to form the source/drain region are boron ions, the boron ions can be diffused into the buried oxide layer.

FIG. 1 is a cross-sectional view showing a transistor formed at an SOI semiconductor substrate and FIG. 2 is a graph showing an impurity density, taken along a line I–I' of FIG. 1. As illustrated in FIG. 2, a horizontal axis represents a depth of a semiconductor substrate from a surface of an SOI layer and a vertical axis represents the impurity concentration according to the depth of the semiconductor substrate.

Referring to FIGS. 1 and 2, buried oxide and SOI layers 2 and 3 are sequentially staked on an entire surface of a semiconductor substrate 1. A gate pattern 6 is disposed on an active region of the SOI layer 3 to cross over the active region. The gate pattern 6 consists of a gate insulating layer 4 and a gate electrode 5, which are sequentially stacked on the active region. An impurity diffusion layer 7 is disposed at both active regions of the gate pattern 6. The impurity diffusion layer 7 corresponds to a source/drain region and is doped with boron ions. Thus, a transistor having the foregoing structure is to be a positive-channel metal oxide semiconductor ("PMOS") transistor.

A line 'A' of FIG. 2 represents the boron ions concentration according to the depth of the semiconductor substrate. As shown by line 'A', the solubility and diffusion coefficient of the buried oxide layer 2 allows boron ions to be diffused into the buried oxide layer 2. Further, the boron ions may be diffused into the semiconductor substrate 1 through the buried oxide layer 2. Therefore, resistance of the impurity diffusion layer 7 is increased, thereby deteriorating characteristics of the transistor.

Also, in the case that the transistor is a negative-channel metal oxide semiconductor ("NMOS") transistor (not shown), the boron ions are implanted into a channel region between the source and drain regions to control a threshold voltage. In this case, the boron ions may be diffused into the buried oxide layer 2 or the semiconductor substrate 1. Thus, the concentration of the implanted boron ions is reduced to vary the threshold voltage of the NMOS transistor.

SUMMARY OF THE INVENTION

A feature of the present invention is to provide a method of forming an SOI semiconductor substrate that prevents impurities implanted into an SOI layer from being diffused into a buried oxide layer and a semiconductor substrate, and the SOI semiconductor substrate formed thereby.

In accordance with an aspect of the present invention, the invention is to provide a method of forming an SOI semiconductor substrate is provided. The method according to an embodiment of the invention includes forming a porous silicon layer on a support substrate. Epitaxial and diffusion barrier layers are sequentially formed on the porous silicon layer. A buried oxide layer is formed on a handle substrate. The diffusion barrier layer is in contact with the buried oxide layer to be bonded. The support substrate is etched until the porous silicon layer is exposed and the porous silicon layer is etched until the epitaxial layer is exposed. The diffusion barrier layer is formed by an insulating layer having a lower impurity diffusion coefficient as compared with the buried oxide layer. The epitaxial layer is an SOI layer. The diffusion barrier layer prevents impurities implanted into the SOI layer from being diffused into the buried oxide layer or the handle substrate.

More specifically, before forming the diffusion barrier layer, a buffer insulating layer may be further formed on the epitaxial layer.

According to another embodiment of the present invention, the method includes implanting hydrogen ions into a support substrate to form a microbubble layer apart from a surface of the support substrate to a predetermined depth and to form an SOI layer on the microbubble layer. A diffusion barrier layer is formed over the SOI layer. A buried oxide layer is formed on a handle substrate. The diffusion barrier layer is in contact with the buried oxide layer to be bonded. The bonded support and handle substrates are annealed to separate the support substrate from the SOI layer on the basis of the microbubble layer. Here, the diffusion barrier layer is formed by an insulating layer having a lower impurity diffusion coefficient as compared with the buried oxide layer.

Further, before forming the diffusion barrier layer, a buffer insulating layer may be further formed on the SOI layer.

According to still another embodiment of the present invention, the method includes implanting oxygen ions into a semiconductor substrate to form an oxygen implantation layer apart from a surface of the semiconductor substrate to a predetermined depth. Element ions are implanted into the semiconductor substrate having the oxygen implantation layer to form an element implantation layer. The element implantation layer is in contact with a top surface of the oxygen implantation layer and is apart from the surface of the semiconductor substrate to a depth, which is lower than the predetermined depth. The semiconductor substrate having the element implantation layer is annealed to form buried oxide, diffusion barrier and SOI layers. At this time, the oxygen implantation layer is formed by the buried oxide layer and the element implantation layer is formed by the diffusion barrier layer. A portion of the semiconductor substrate on the diffusion barrier layer is formed by the SOI layer.

In accordance with another aspect of the present invention, an SOI semiconductor substrate includes semiconductor substrate and buried oxide layer stacked on the semiconductor substrate. An SOI layer is disposed on the buried oxide silicon layer and a diffusion barrier layer is intervened between the buried oxide silicon and SOI layers. The diffusion barrier layer is formed by an insulating layer having a lower impurity diffusion coefficient as compared with the buried oxide layer.

More particularly, a buffer insulating layer may be further intervened between the diffusion barrier and SOI layers.

DESCRIPTION OF PREFERRED EMBODIMENTS

Figure 1:
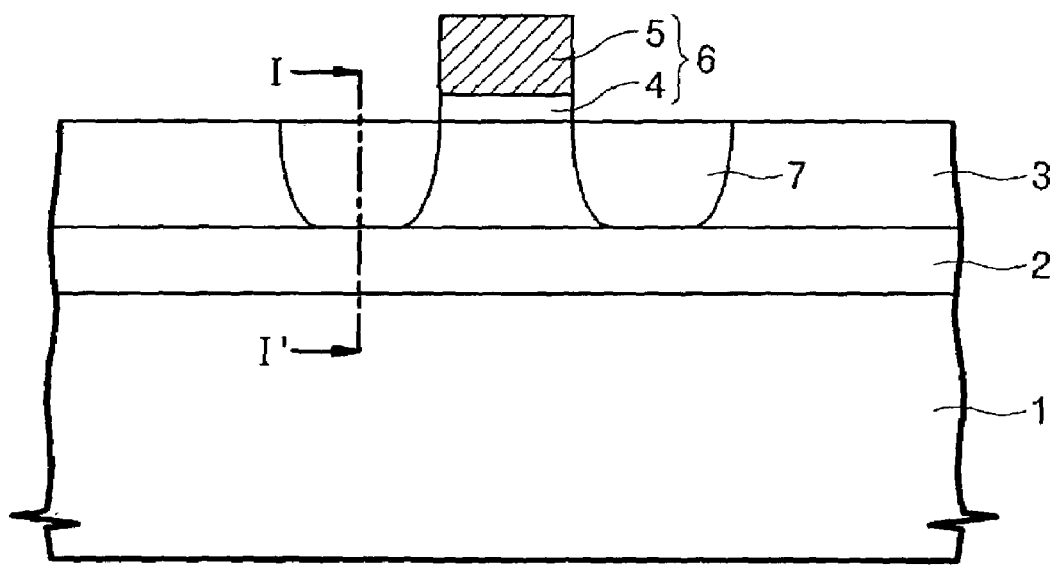
FIG. 1 is a cross-sectional view showing a transistor formed at a conventional SOI semiconductor substrate.
Figure 2:
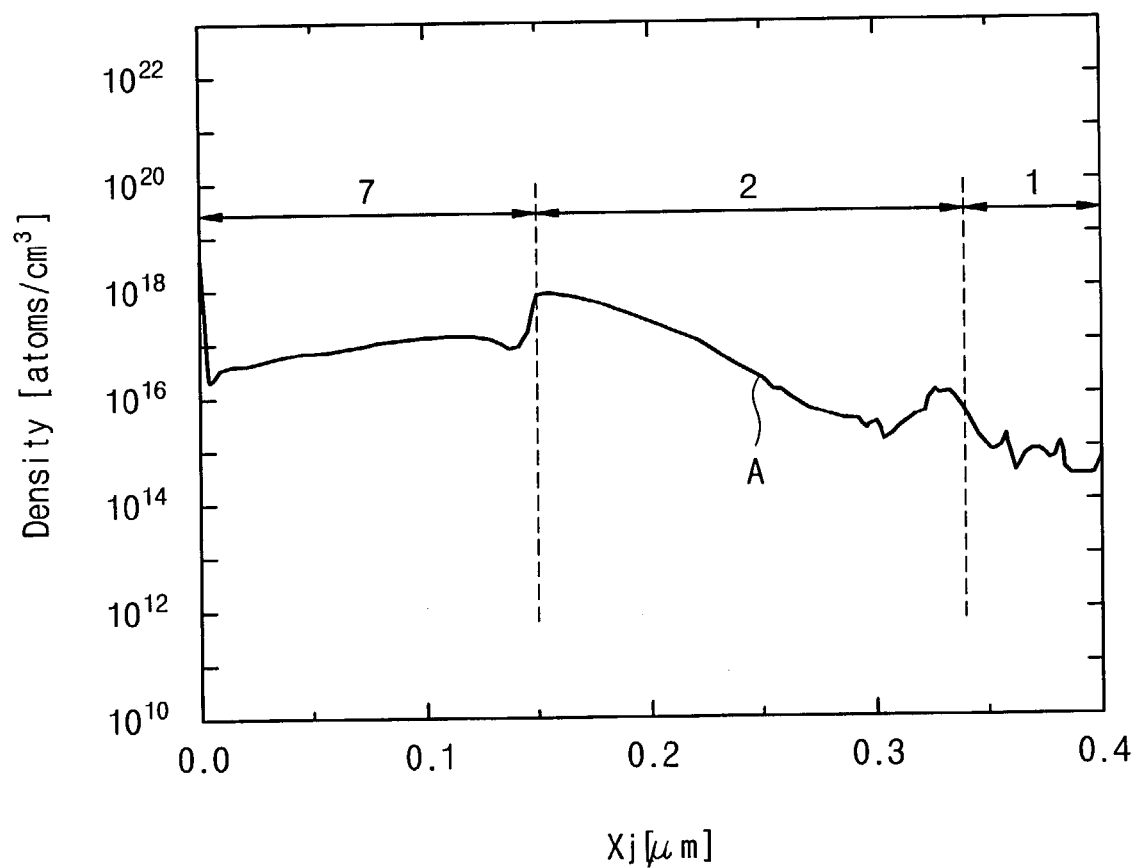
FIG. 2 is a graph showing an impurity concentration, taken along a line I–I' of FIG. 1.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout.

FIGS. 3 through 6 are cross-sectional views showing a method of forming an SOI semiconductor substrate according to a preferred embodiment of the present invention.

Figure 3:
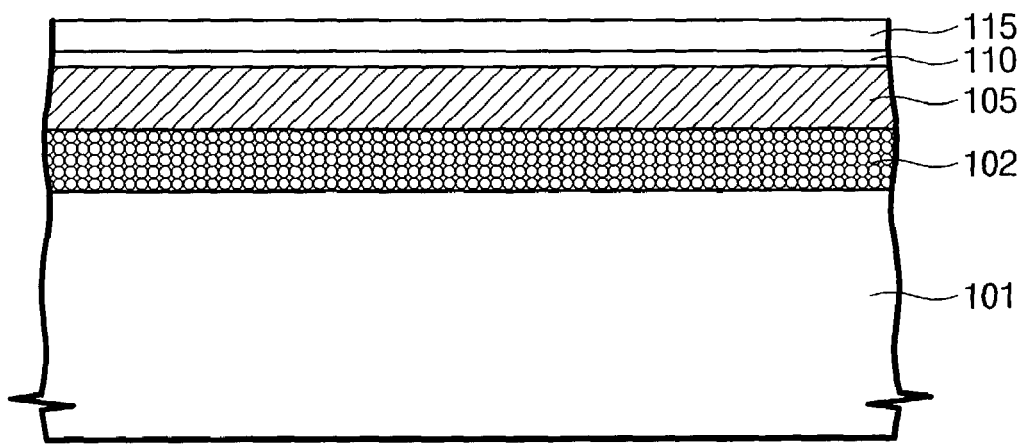
FIGS. 3 through 6 are cross-sectional views showing a method of forming the SOI semiconductor substrate according to a preferred embodiment of the present invention.
Figure 4:
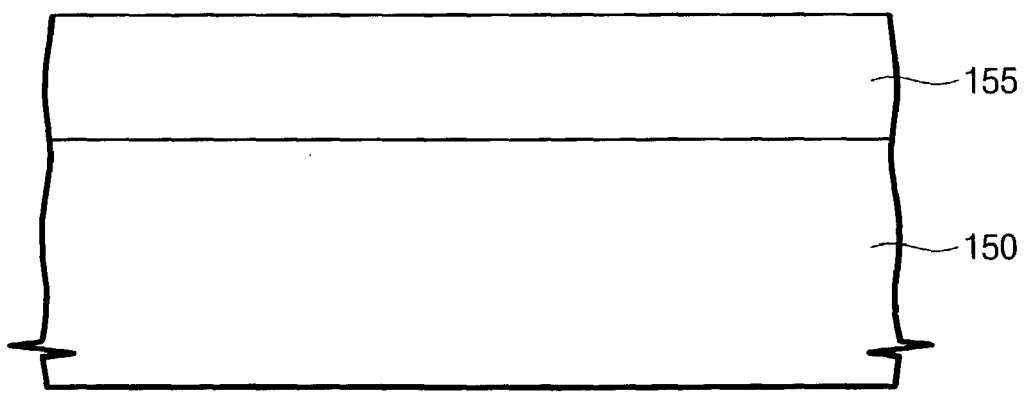

Referring to FIGS. 3 and 4, a porous silicon layer 102 is formed on a support semiconductor substrate 101 (hereinafter referred to as 'support substrate') having single crystalline silicon.

An anodizing method may be used for forming the porous silicon layer 102.

The anodizing method will be briefly explained as follows. First, a surface of the support substrate 101 is exposed to a reaction liquid including fluoric acid (HF). A negative voltage is applied to the support substrate 101 and a positive voltage is applied to the reaction liquid. Accordingly, the surface of the support substrate 101 is partially oxidized and the oxidized portions are etched by the fluoric acid (HF). As a result, the porous silicon layer 102 with many pits is formed on the surface of the support substrate 101. The amount of time necessary to form the porous silicon layer 102 or density of the porous silicon layer 102 is related to the amount of an electric current supplied to the reaction liquid or a concentration of the reaction liquid.

Since the porous silicon layer 102 has a lower density than the support substrate 101, it has an etch selectivity with respect to the support substrate 101. On the other hand, the porous silicon layer 102 has the same single crystalline structure as the support substrate 101.

An epitaxial layer 105 is formed on the porous silicon layer 102. The epitaxial layer 105 is a silicon layer having a single crystalline structure. This is because the porous silicon layer 102 has a single crystalline structure. Since the density of the epitaxial layer 105 is higher than the porous silicon layer 102, the porous silicon layer 102 has etch selectivity with respect to the epitaxial layer 105.

Preferably, a buffer insulating layer 110 is formed by a thermal oxide layer on the epitaxial layer 105. In addition, the buffer insulating layer 110 may be formed by a CVD silicon oxide layer. A diffusion barrier layer 115 is formed on the buffer insulating layer 110.

Meanwhile, a buried oxide layer 155 is formed on a handle semiconductor substrate 150 (hereinafter referred to as 'handle substrate'). The buried oxide layer 155 may be formed by thermal oxide or CVD silicon oxide layers.

The diffusion barrier layer 115 is formed by an insulating layer having a lower impurity diffusion coefficient as compared with the buried oxide layer 155. For example, it is preferable that the diffusion barrier layer 115 is formed by the insulating layer having a lower boron ions diffusion coefficient. The diffusion barrier layer 115 may be composed of either one of a silicon nitride layer (SiN) and a silicon oxynitride layer (SiON).

The buffer insulating layer 110 serves to alleviate a stress due to a difference between thermal expansion coefficients of the diffusion barrier and epitaxial layers 115 and 110.

Figure 5:
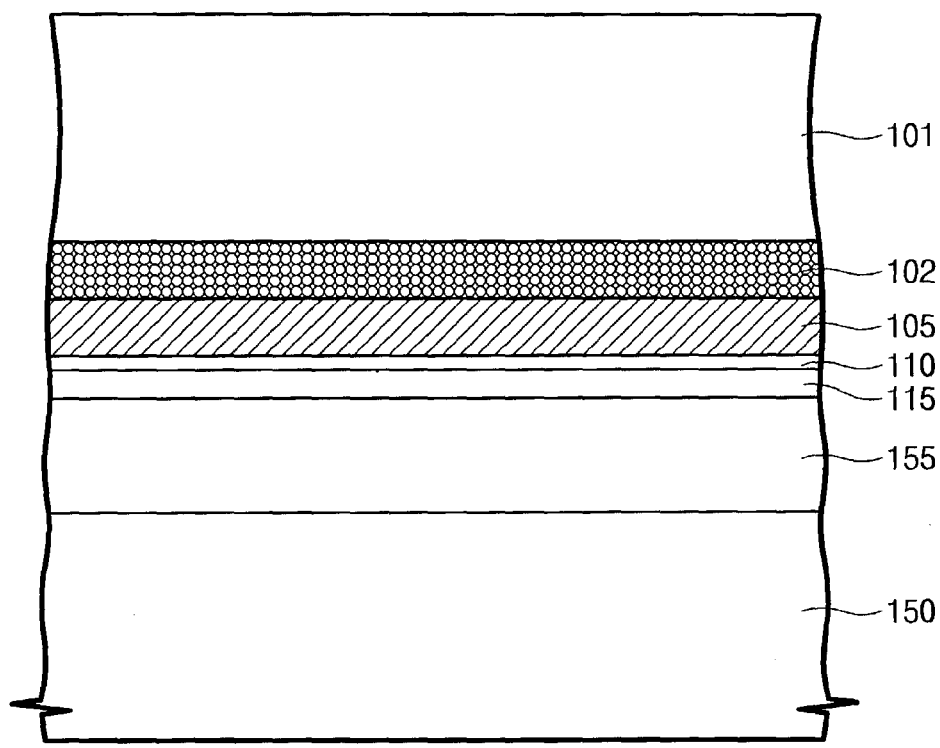
Figure 6:
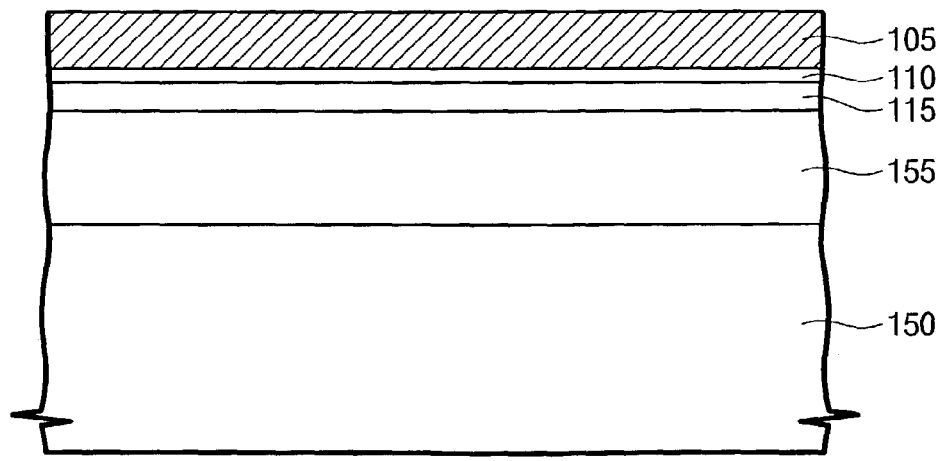

Referring to FIGS. 5 and 6, the diffusion barrier layer 115 disposed on the support substrate 101 is in contact with the buried oxide layer 155 disposed on the handle substrate 150 to be bonded. Here, the support substrate 101 is disposed at an uppermost part of a bonded corporation and the handle substrate 150 may be disposed at a lowermost part of the bonded corporation.

Thereafter, the support substrate 101 is etched until the porous silicon layer 102 is exposed because the porous silicon layer 102 has etch selectivity with respect to the support substrate 101. Here, a reactive ion etch method may be used for etching the support substrate 101.

The exposed porous silicon layer 102 is etched until the epitaxial layer 105 is exposed. After exposing the epitaxial layer 105, a polishing process can be further performed to planarize the surface of the epitaxial layer 105.

Thus, the buried oxide, diffusion barrier and buffer insulating layers 155, 115 and 110, which are stacked sequentially, are interposed between the epitaxial layer 105 and the handle substrate 150. Here, the epitaxial layer 105 is used as a silicon-on-insulator (SOI) layer. As a result, a SOI semiconductor substrate having the foregoing structure is formed. The diffusion barrier layer 115 may prevent impurities, such as the boron ions, which are implanted into the SOI layer 105, from being diffused into the buried oxide layer 155 or the handle substrate 150. Therefore, degradation in characteristics of a transistor formed by implanting impurities is prevented.

FIGS. 7 through 11 are cross-sectional views showing a method of forming an SOI semiconductor substrate according to another embodiment of the present invention. In this embodiment, elements having the same property or function as the elements of the foregoing embodiment refer to like numbers and names.

Figure 7:
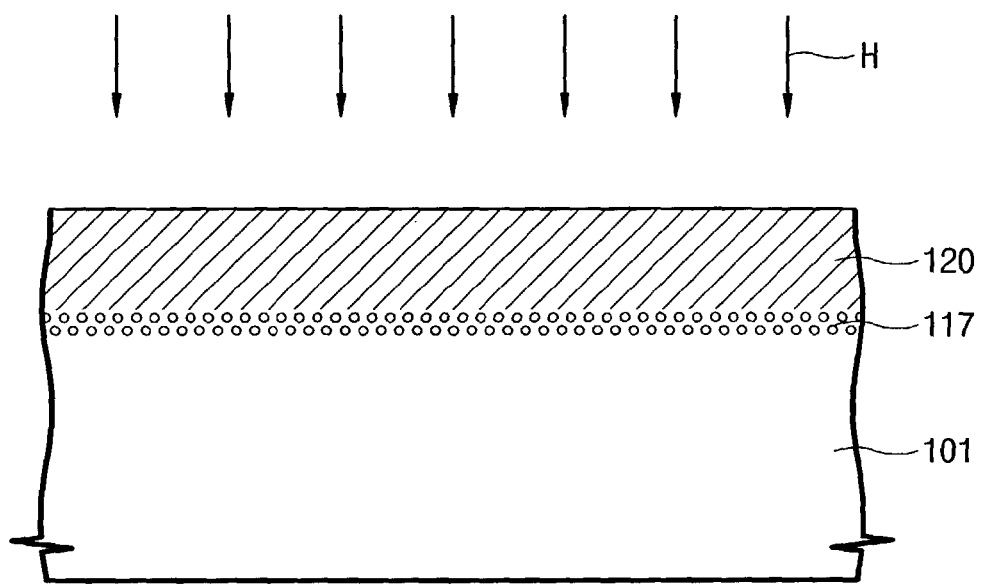
FIGS. 7 through 11 are cross-sectional views showing the method of forming the SOI semiconductor substrate according to another embodiment of the present invention.
Figure 8:
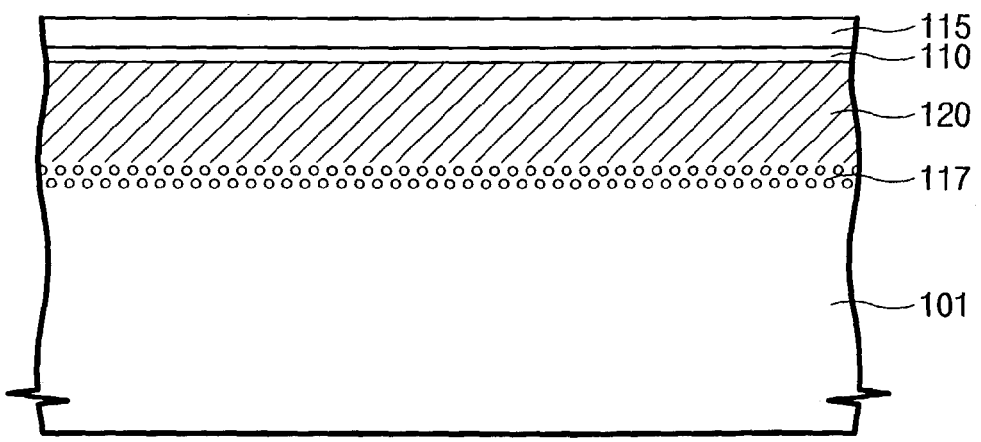
Figure 9:
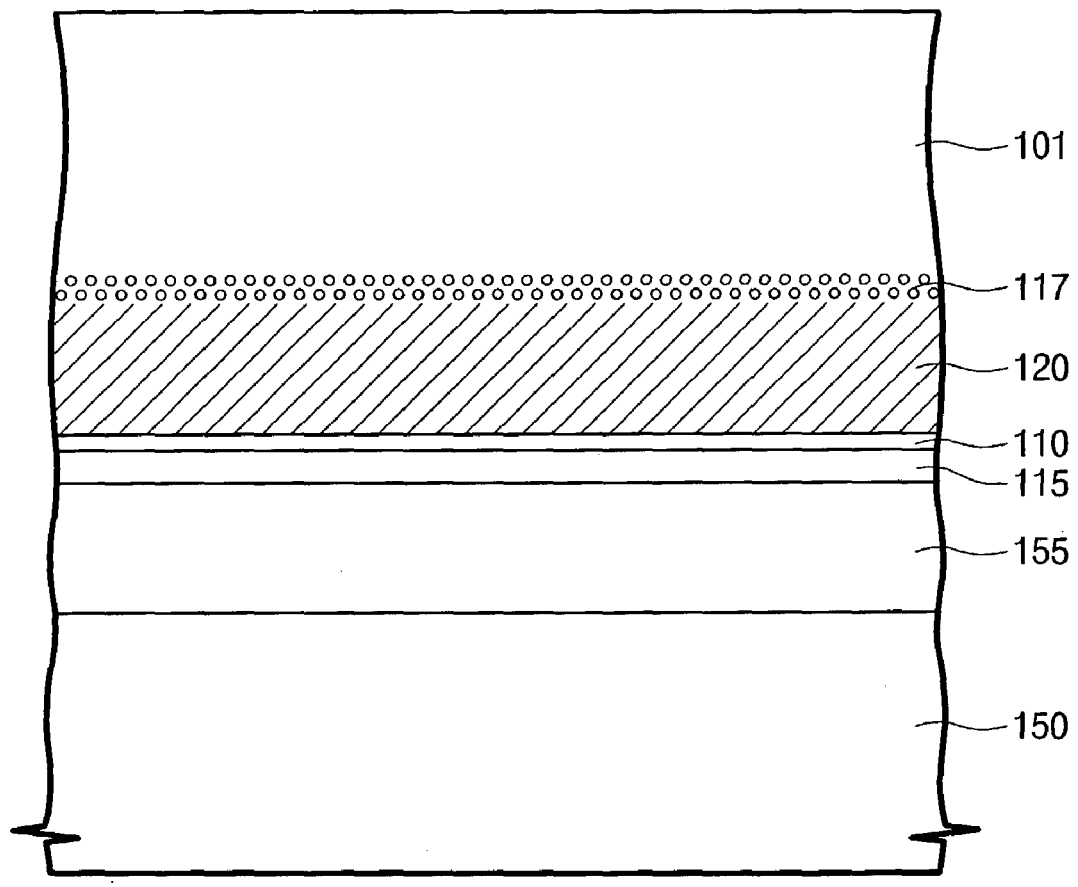

Referring to FIGS. 7, 8 and 9, hydrogen ions (H) are implanted into the support substrate 101 to form a microbubble layer 117 apart from the surface of the support substrate 101 to a predetermined depth. At this time, a portion of the support substrate 101 on the microbubble layer 117 becomes an SOI layer 120. The hydrogen ions (H) are implanted at a predetermined temperature. For example, the process may be performed at a temperature of 500° C. The hydrogen ions have a strong tendency to secede from the support substrate 101, likewise, the implanted hydrogen ions tend to secede from the support substrate 101 due to the thermal energy obtained by the predetermined temperature. As a result, the microbubble layer 117 is formed at a region where the hydrogen ions are implanted.

Preferably, the buffer insulating layer 110 is formed on the SOI layer 120. The diffusion barrier layer 115 is formed on the buffer insulating layer 110.

It is preferable that the buffer insulating layer 110 is formed by thermal oxide or CVD silicon oxide layers. The buffer insulating layer 110 serves to alleviate a stress between the diffusion barrier and SOI layers 115 and 120.

The diffusion barrier layer 115 is formed by an insulating layer having a lower impurity diffusion coefficient as compared with the buried oxide layer 155. For example, it is preferable that diffusion barrier layer 115 is formed by an insulating layer having a lower boron ions diffusion coefficient. Preferably, the diffusion barrier layer 115 may be composed of either one of a silicon nitride layer (SiN) or a silicon oxynitride layer (SiON).

The buried oxide layer 155 formed using the same method as the first embodiment on the handle substrate 150 is in contact with the diffusion barrier layer 115 to be bonded. Thus, the support and handle substrates 101 and 150 are combined.

Figure 10:
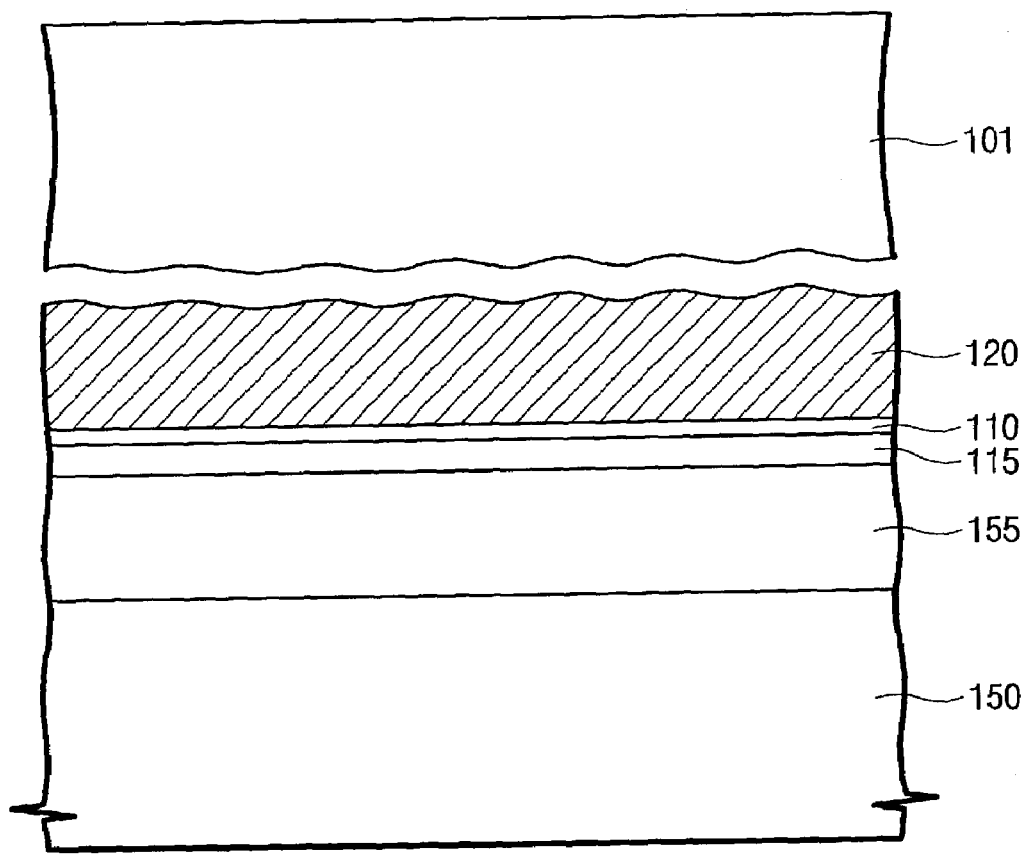
Figure 11:
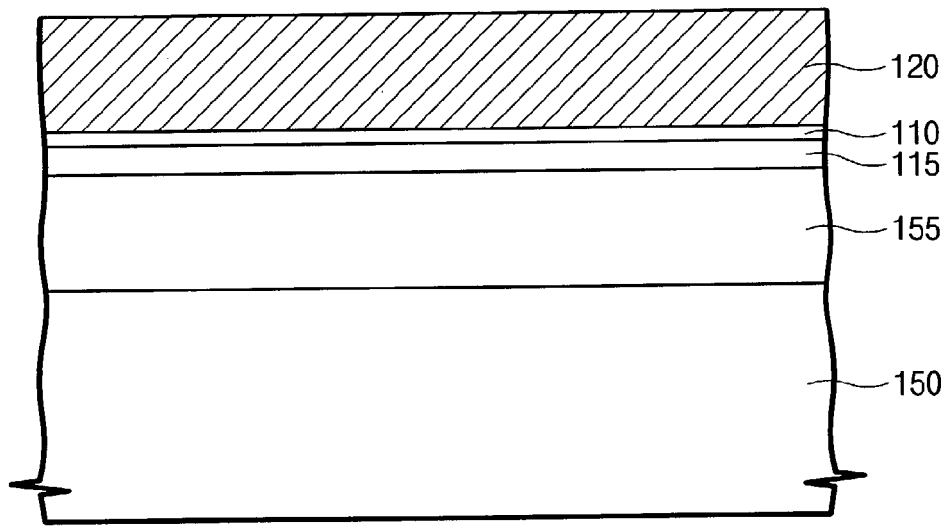

Referring to FIGS. 10 and 11, the combined support and handle substrates 101 and 150 are annealed at different predetermined temperature. Accordingly, hydrogen gases in microbubble layer 117 have a thermal energy to combine microbubbles. In this process, the support substrate 101 is apart from the SOI layer 120 on the basis of the microbubble layer 117. Thereafter, a polishing process is preferably performed to planarize the surface of the SOI layer 120.

The diffusion barrier and buffer insulating layers 115 and 110, which are sequentially stacked, are interposed between the SOI and buried oxide layers 120 and 155 by the foregoing method. The diffusion barrier layer 115 may prevent the impurities such as the boron ions, which are implanted into the SOI layer, from being diffused into the buried oxide layer 155 or the handle substrate 150. Therefore, degradation in characteristics of a transistor formed by implanting the impurities is prevented.

Figure 12:
FIGS. 12 through 14 are cross-sectional views showing the method of forming the SOI semiconductor substrate according to still another embodiment of the present invention.
Figure 12:
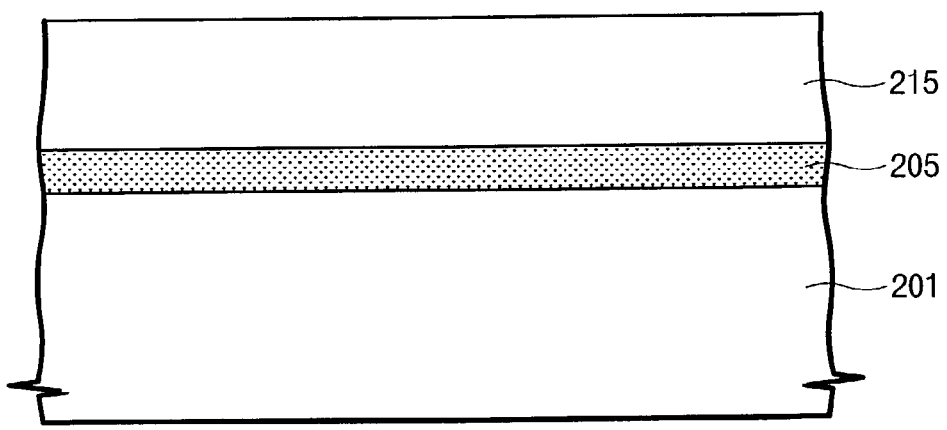
Figure 13:
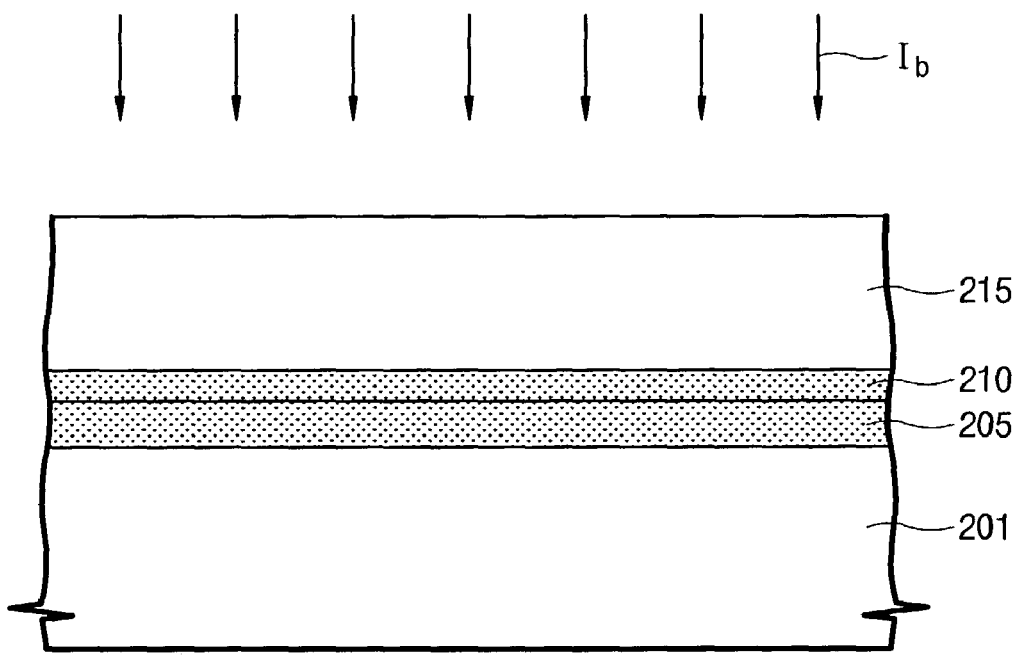
Figure 14:
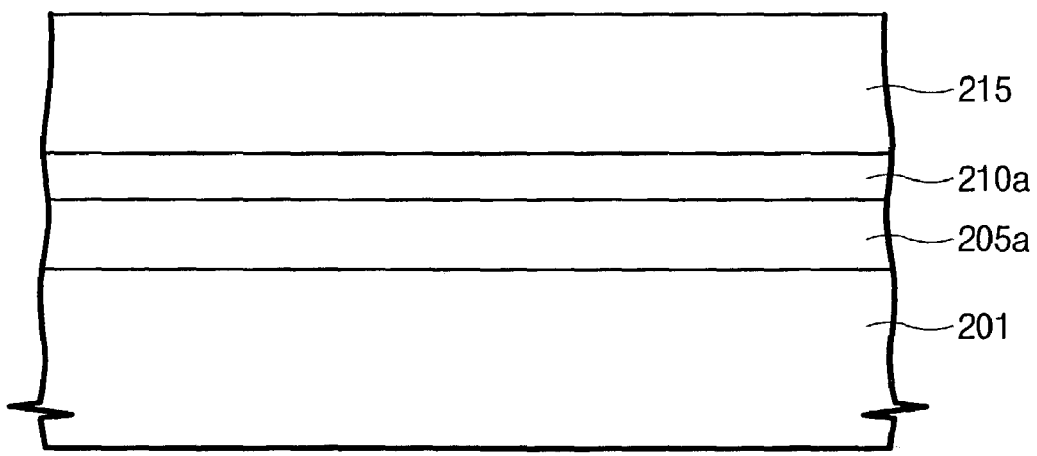

FIGS. 12 through 14 are cross-sectional views showing a method of forming an SOI semiconductor substrate according to still another embodiment of the present invention.

Referring to FIGS. 12, 13 and 14, oxygen ions (Ia) are implanted into a semiconductor substrate 201 to form an oxygen implantation layer 205 apart from a surface of the semiconductor substrate 201 to a predetermined depth. Element ions (Ib) are implanted into the semiconductor substrate 201 having the oxygen implantation layer 205 to form an element implantation layer 210. The element implantation layer 210 is in contact with the oxygen implantation layer 205 and is apart from the surface of the semiconductor substrate 201 to a depth, which is less than the predetermined depth. Here, a portion of the semiconductor substrate 201 disposed on the element implantation layer 210 is formed to be an SOI layer 215.

The semiconductor substrate 201 having the element and oxygen implantation layers 210 and 205 is annealed at a predetermined temperature to form buried oxide and diffusion barrier layers 205a and 210a. At this time, the oxygen and element implantation layers 205 and 210 are formed by the buried oxide and diffusion barrier layers 205a and 210a, respectively. In addition, lattices of the SOI layer 215, which are defected by implanting the ions (Ia and Ib), may be cured by the annealing process.

The diffusion barrier layer 210a is formed by an insulating layer having an impurity diffusion coefficient, which is lower than the buried oxide layer 205a. For example, the diffusion barrier layer 210a is preferably formed by the insulating layer having a lower boron ions diffusion coefficient. The diffusion barrier layer 210a may be composed of either one of a silicon nitride layer (SiN) and a silicon oxynitride layer (SiON).

In the case that the diffusion barrier layer 210a is a silicon nitride layer, nitrogen ions are preferably implanted into the element implantation layer 210. In the case that the diffusion barrier layer 210a is a silicon oxynitride layer, the nitrogen and oxygen ions are preferably implanted into the element implantation layer 210.

The diffusion barrier layer 210a may prevent impurities such as the boron ions, which are implanted into the SOI layer 215, from being diffused into the buried oxide layer 205 or the semiconductor substrate 201. Therefore, degradation in characteristics of a transistor formed at the SOI layer 215 is prevented.

Figure 15:
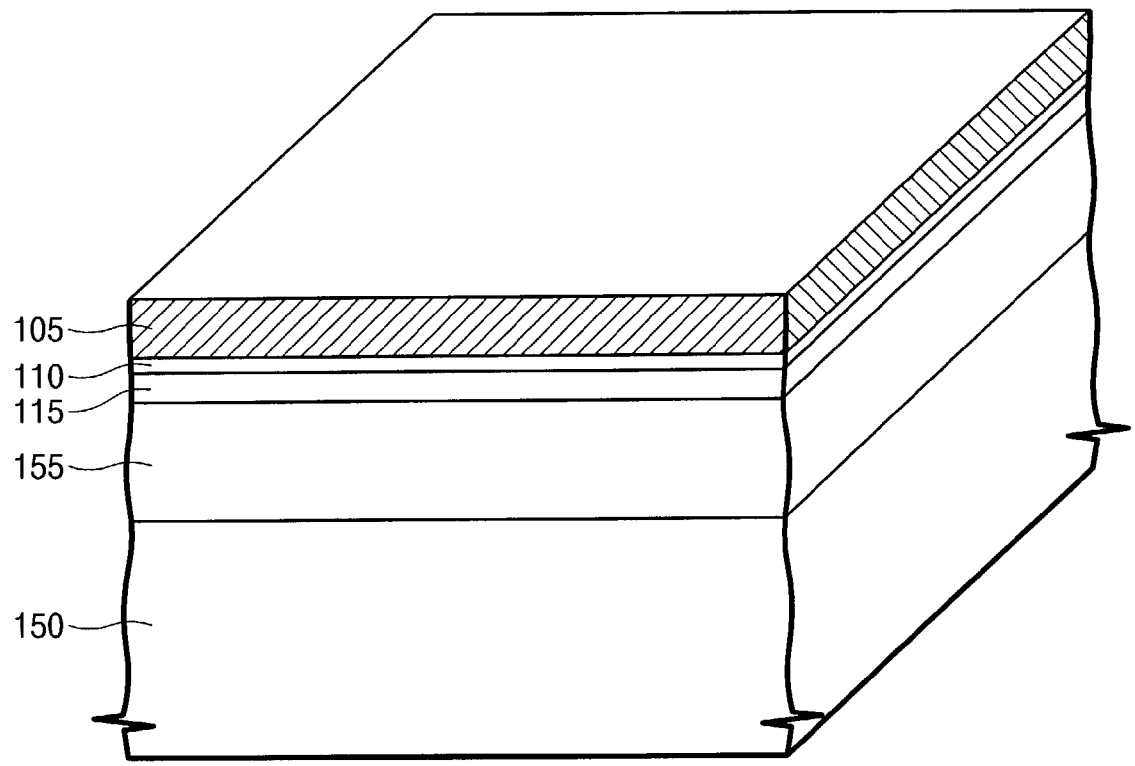
FIG. 15 illustrates an SOI semiconductor substrate according to an embodiment of the present invention.

FIG. 15 is an outline view showing an SOI semiconductor substrate according to an embodiment of the present invention.

According to an embodiment of the present invention, a semiconductor device includes a handle substrate 150, a buried oxide, diffusion barrier, buffer insulating and SOI layers 155, 115, 110 and 105 that are sequentially stacked.

Preferably, the buried oxide layer 155 is formed by a thermal oxide layer. Additionally, the buried oxide layer 155 may be formed by a CVD silicon oxide layer. The diffusion barrier layer 115 is formed of an insulating layer having a lower impurity diffusion coefficient as compared with the buried oxide layer 155. For example, the diffusion barrier layer 115 is formed by the insulating layer having a lower boron ions diffusion coefficient. The diffusion barrier layer 115 may be composed of either one of a silicon nitride layer (SiN) and a silicon oxynitride layer (SiON).

The diffusion barrier layer 115 prevents the impurities such as the boron ions, which are implanted into the SOI layer 105, from being diffused into the buried oxide layer 155 or the handle substrate 150. Therefore, degradation in characteristics of a transistor formed at the SOI layer 105 is prevented.

Preferably, the buffer insulating layer 110 is formed by the thermal oxide layer. Additionally, the buffer insulating layer 110 may be formed by the CVD silicon oxide layer. The buffer insulating layer 110 suppresses a stress due to a difference between thermal expansion coefficients of the SOI and diffusion barrier layers 105 and 115.

The SOI layer 105 may be formed by an epitaxial layer or a portion of a support substrate.

According to an embodiment of the present invention as described above, the diffusion barrier layer is formed between the buried oxide and SOI layers, which are sequentially stacked. The diffusion barrier layer may prevent the impurities implanted into the SOI layer from being diffused into the buried oxide layer and the semiconductor substrate. Therefore, degradation in characteristics of the transistor formed on the SOI layer is prevented.

Although illustrative embodiments have been described herein with reference to the accompanying drawings, it is to be understood that the present disclosure is not limited to those precise embodiments, and that various changes and modifications may be effected therein by one of ordinary skill in the pertinent art without departing from the scope or spirit of the present disclosure. All such changes and modifications are intended to be included within the scope of the present disclosure as set forth in the appended claims.

What is claimed is:

1. A method of forming an SOI semiconductor substrate comprising:
   forming a porous silicon layer on a support substrate;
   sequentially forming an epitaxial layer, a buffer insulating layer and a diffusion barrier layer on the porous silicon layer;
   forming a buried oxide layer on a handle substrate;
   after forming the diffusion barrier layer, contacting the diffusion barrier layer with the buried oxide layer to be bonded;
   etching the support substrate until the porous silicon layer is exposed; and
   etching the porous silicon layer until the epitaxial layer is exposed,
   wherein the diffusion barrier layer is formed of an insulating layer having a lower boron diffusion coefficient as compared with the buried oxide layer, wherein the buffer insulating layer is silicon oxide formed by thermal oxidation or CVD, wherein the buffer insulating layer alleviates stress due to a difference between thermal expansion coefficients of the diffusion barrier and epitaxial layers, and wherein the diffusion barrier layer is composed of either one of a silicon nitride layer or a silicon oxynitride layer.

2. The method as claimed in claim 1, wherein the epitaxial layer is an SOI layer.

3. The method as claimed in claim 1, wherein the porous silicon layer has a lower density than the support substrate and the epitaxial layer.

4. The method as claimed in claim 1, wherein the epitaxial layer is a single crystalline silicon layer.

5. The method as claimed in claim 1, wherein the buried oxide layer is silicon oxide formed by thermal oxidation or CVD.

6. The method as claimed in claim 1, further comprising planarizing a surface of the SOI layer after etching the porous silicon layer.

* * * * *